United States Patent
Seki et al.

(10) Patent No.: US 7,347,683 B2
(45) Date of Patent: Mar. 25, 2008

(54) MOLD AND MOLDING APPARATUS USING THE SAME

(75) Inventors: Junichi Seki, Yokohama (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 354 days.

(21) Appl. No.: 11/058,195

(22) Filed: Feb. 16, 2005

(65) Prior Publication Data
US 2005/0208171 A1 Sep. 22, 2005

(30) Foreign Application Priority Data
Feb. 20, 2004 (JP) ............................ 2004-044727

(51) Int. Cl.
*B29C 43/04* (2006.01)
(52) U.S. Cl. ...................... 425/182; 425/385; 425/390; 425/397; 425/403
(58) Field of Classification Search ........ 425/182–183, 425/389–390, 385, 400, 403, 407, 396–397
See application file for complete search history.

(56) References Cited

U.S. PATENT DOCUMENTS

| | | | | |
|---|---|---|---|---|
| 4,044,984 A | * | 8/1977 | Shimizu et al. ............ | 425/127 |
| 5,368,800 A | * | 11/1994 | Scolamiero et al. ........ | 264/219 |
| 5,454,705 A | * | 10/1995 | Back .......................... | 425/116 |
| 5,772,905 A | | 6/1998 | Chou .......................... | 216/44 |
| 6,712,598 B2 | * | 3/2004 | Jensen ........................ | 425/409 |
| 7,150,622 B2 | * | 12/2006 | Choi et al. .................. | 425/385 |

* cited by examiner

*Primary Examiner*—Gupta Yogendra
*Assistant Examiner*—Thu Khanh T. Nguyen
(74) *Attorney, Agent, or Firm*—Fitzpatrick, Cella, Harper & Scinto

(57) ABSTRACT

A molding apparatus for patterning a workpiece includes a mold having a pattern to be transferred to the workpiece, with the pattern including recesses, a first support member for supporting the mold, and a second support member, arranged opposite to the first support member, for supporting the workpiece. A pressing mechanism brings the first and second support members close to each other and presses the mold and the workpiece together so as to transfer, to the workpiece, the pattern on the mold. Recessed portions are provided on at least one of a surface of the mold on the first support member side, a region of the first support member, and a region of the second support member. The recessed portions correspond to recesses in the pattern of the mold.

3 Claims, 5 Drawing Sheets

MOLD AND MOLDING APPARATUS USING THE SAME

BACKGROUND OF THE INVENTION

1. Field of the Invention

The present invention relates to a press molding apparatus, a press mold, and a press molding method, for transferring the features of a mold to a work (workpiece) under the application of pressure.

2. Description of the Related Art

In recent years, micro-fabrication technology for press transferring fine structures on a mold to a workpiece, such as resin or metal, have been developed and become a focus of attention. This technology, called nano-imprint or nano-embossing, has a resolution on the order of several nanometers. In addition, it can mold 3D structures on a wafer by one operation. For these reasons, this technology is expected to be applicable to a wide variety of fields, such as the next-generation semiconductor fabrication, the fabrication of optical elements like photonic crystals, and the fabrication of biochips such as µ-TAS chips.

There have also been proposed methods of pressing a mold into a resist on a semiconductor wafer to create an imprint pattern so as to produce a pattern on the semiconductor wafer through the process of ion milling.

There is disclosed a method of pressing a mold into a resist to mold the resist and etching the resist pattern to form holes in a wafer on which the resist has been carried (U.S. Pat. No. 5,772,905).

The following describes the current state of the above-mentioned molding technology with reference to FIGS. 4 to 6.

FIG. 4 shows a typical example of the structure of the prior art technology. A mold 104 is typically micro-fabricated on a wafer of Si or $SiO_2$ by EB lithography, FIB, X-ray lithography, etc, or replicated by Ni electroforming. A work is typically resin 105 coated on a wafer 106 of a desired material, or a resin plate. The mold 104 and the work (workpiece) are sandwiched between a mold pressing member 103 and a wafer pressing member 107, and pressed together by means of a press mechanism (not shown).

FIG. 5 shows a pressed state in the structure of FIG. 4. In this case, the pressing members, the mold 104, and the wafer 106 are partially deformed, crushing a large recess almost flat. As a result, since the work is molded as shown in FIG. 6, the accuracy of shaping the work is reduced. Such a phenomenon becomes noticeable as the molding pressure increases or the recessed area is shallower.

It is therefore desired to have a molding technique capable of transferring features with a high degree of precision for finer fabrication by reducing the deformation of a mold and a work in the vicinity of a recess on the mold.

SUMMARY OF THE INVENTION

It is an object of the present invention to provide a mold, a molding apparatus, and the like, which can reduce the deformation of the mold and a work due to a pressing force.

In order to solve the above-mentioned problem, the present invention uses the following means.

That is, according to the present invention, there is provided a molding apparatus for patterning a workpiece using a mold. The apparatus includes a first support member for supporting the mold, a second support member, arranged opposed to the first support member, for supporting the workpiece, and press means for bringing the first and second support members close to each other to press the mold and the workpiece together so as to transfer, to the workpiece, the pattern of recessed and raised features formed on the mold.

In this structure, recessed portions are provided in positions, corresponding to recesses in the pattern of the mold, on at least one of the surface of the mold on the support member side, the region or surface of the first support member on the mold side, and the region or surface of the second support member on the workpiece side.

It is preferable that the recesses provided in positions, corresponding to the recessed and raised features of the mold, on the surface(s) selected from the surface of the mold on the support member side, the surface of the first support member on the mold side, and the surface of the second support member on the workpiece side, be filled with a material having a lower Young's modulus than the material that forms the features surrounding each recess (that is, the raised features).

According to the present invention, there is also provided a mold for use in patterning the work surface of a workpiece. The mold has recesses provided on the opposite side of the mold surface in positions corresponding to the recessed features of the mold surface.

According to the present invention, the recesses corresponding to the recessed features of the mold surface are provided in the press member (first or second support member), or on the backside of the mold. In other words, hollow portions are provided in the paths of transmission of molding force to prevent in part the transmission of the molding force. This prevents the deformation of the mold and the work in the recessed areas of the mold surface, enabling the transfer of the features on the mold to the work with a high degree of precision. Instead of the hollow portions, such a material to prevent the transmission of force may also be used. This can achieve precise transfer even in the case where the precision of the mold and the work is inadequate.

Further features and advantages of the present invention will become apparent from the following description of exemplary embodiments (with reference to the attached drawings).

DESCRIPTION OF THE EMBODIMENTS

Figure 1:
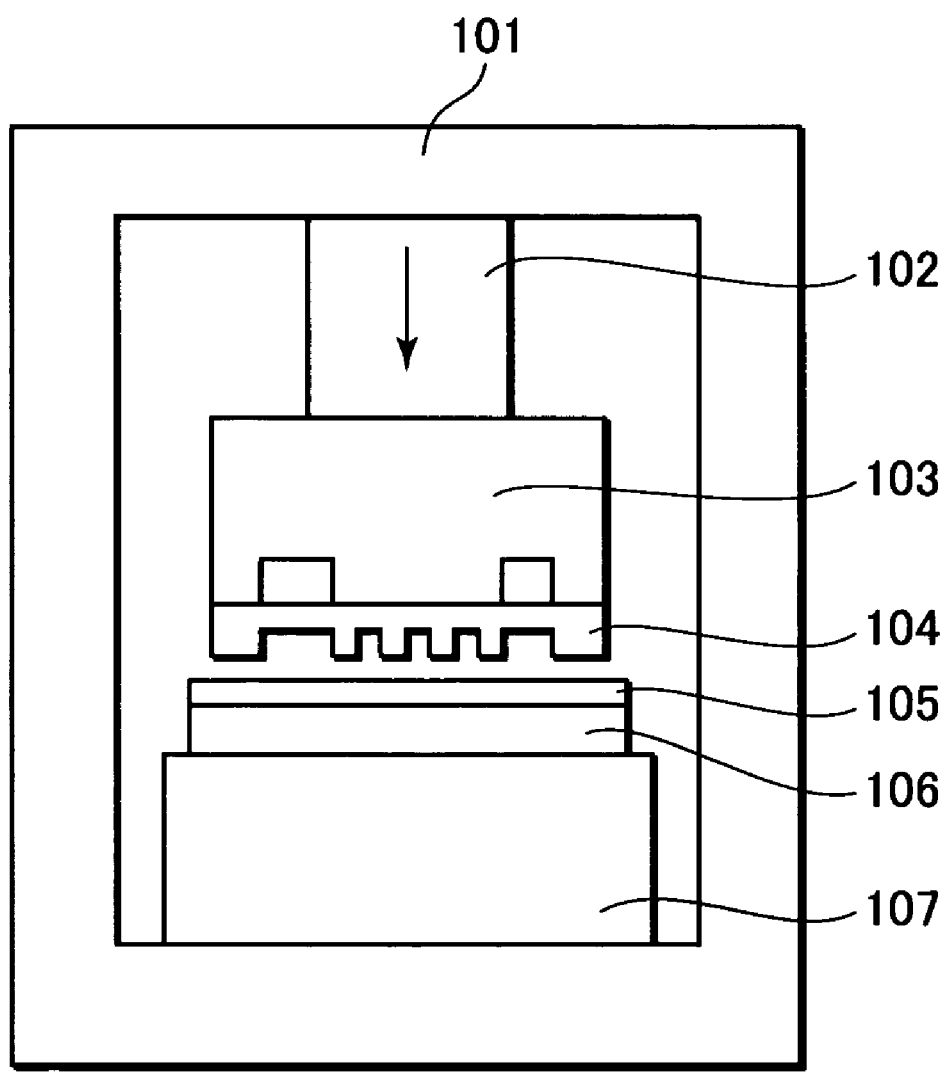
FIG. 1 is a cross sectional view for explaining the structure of an apparatus according to a first embodiment of the present invention.

In preferred embodiments of the present invention, any of the above-mentioned structures is applied in such a manner that hollow portions are provided in the paths of transmission of molding force, for example, by providing recesses in positions, corresponding to recesses of the mold surface, on the backside of the mold or in a pressing member, for preventing in part the transmission of the molding force.

This helps to prevent the deformation of the mold and the work in the recessed areas of the mold surface, enabling the transfer of the features on the mold to the work with a high degree of precision. Instead of the hollow portions, such a material to prevent the transmission of force can also be used.

When the recesses are provided on the backside of the mold, it is preferable to provide them with respect to the recesses of the mold surface in the direction parallel to the direction of the molding force.

These techniques may be applied restrictively to only wide recesses on the mold surface. In this case, since the hollow portions are formed in limited areas, the manufacturing cost can be reduced.

In particular, when the hollow portions are provided in the pressing member, the pressing member can be reused for other molds having the same features, enabling a cost reduction. On the other hand, when they are provided in the mold, position errors due to misalignment or thermal deformation can be reduced, thereby improving molding precision.

A material with a low Young's modulus may also be placed between the pressing member and the mold or work. In this case, in addition to the above-mentioned effects, the molding force can be distributed evenly even though the precision of the shape of each member or the precision of the apparatus is inadequate. This makes it possible not only to reduce the cost of manufacturing the member, but also to improve molding precision.

According to the present invention, recesses similar to the recesses formed in the mold, or master, are provided in corresponding positions to those in the mold. The present invention covers the cases where the recesses are provided (1) in a mold support member 103 (mold pressing member in FIG. 1), (2) on the backside of the mold 104 (FIG. 2), and (3) in a work support member 107 (work pressing member in FIG. 1). Of course, the recesses do not need to be provided in all of the mold support member, the mold, and the work support member. It is appropriately selected from (1) to (3) where the recesses are provided. The recesses can be provided in the following locations or combinations of locations: (1), (1)+(2), (1)+(3), (1)+(2)+(3), (2), (2)+(3), and (3). In either of the cases (1), (2), and (3), or combinations of them, it is preferable that recessed and raised features be provided in corresponding positions to the recessed and raised areas of the mold. The "corresponding positions" means corresponding positions in the pressing direction to apply pressure between the mold and the workpiece.

Further, in either of the cases (1), (2), and (3) or combinations of them, the recessed and raised features do not need to be provided in all positions corresponding to the recessed and raised areas of the mold on the workpiece side.

The depths of the recesses do not need to be exactly equal to the depths (step heights) of the mold on the workpiece side. It is preferable, however, that the support member or mold as in the case of (1), (2), or (3), or in any combination of (1), (2), and (3), have recesses in corresponding positions to the recesses of the mold that face the work surface.

It is also preferable that the support member or mold as in the case of (1), (2), or (3), or in any combination of (1), (2), and (3), have raised features in corresponding positions to the raised areas of the mold that face the work surface.

The above describes the case where a plate-shaped mold is used, but the present invention is also applicable to a roll-shaped mold, that is, a mold having raised and recessed features to be transferred to the surface of a cylinder.

EMBODIMENTS

First Embodiment

The first embodiment of the present invention will now be described with reference to FIG. 1.

As shown in FIG. 1, the mold 104 is arranged opposed to the wafer 106 coated with resin 105. The mold 104 is mounted on the mold pressing member 103, while the wafer 106 is mounted on the wafer pressing member 107. Both of the pressing members are connected to each other through a press mechanism 102 and an apparatus frame or casing 101 that receives a reactive force from the press mechanism 102. The press mechanism 102 applies pressure between the mold 104 and the wafer 106 to transfer the surface features of the mold 104 into the resin 105. The press mechanism 102 moves the mold in FIG. 1, but it may move the work, or both.

Grooves of 50 µm deep are formed by precision cutting on the surface of the mold pressing member 103 that faces the backside of the mold 104. The pattern of the grooves may be the same as the pattern on the surface of the mold 104. In this case, however, since small recesses of the mold 104 are deformed by small amounts, only the grooves corresponding to wide recesses are formed in consideration of manufacturing cost. It depends on the required precision of the grooves to be formed. In the embodiment, the grooves are formed corresponding to recesses whose width-to-depth ratio exceeds 20:1 in their narrowest position on the mold 104.

When the mold pressing member 103 as structured above is used to press the mold, the grooves serve as the hollow portions in the paths of transmission of molding force, so that the transmission of the molding force to the recesses on the surface of the mold 104 can be reduced, thereby transferring the features on the mold 104 into the resin 105 with a high degree of precision. This also prevents a waste of molding force.

The pressing member in which the grooves are formed is not limited to the mold pressing member 103. The grooves may be formed in the wafer pressing member 107. For example, if the mold 104 and the wafer 106 vary considerably in material and thickness, they may differ in degree of deformation in the recesses. In such a case, the grooves may be formed in one pressing member, which is larger in degree of deformation than the other, or at symmetrically opposed positions of both pressing members.

According to the embodiment, when the surface features of the mold 104 do not change, if the mold is replaced with another due to mold breakage or degradation, the mold pressing member 103 can be reused. This is particularly suitable for mass production.

Second Embodiment

The second embodiment of the present invention will now be described with reference to FIG. 2.

Figure 2:
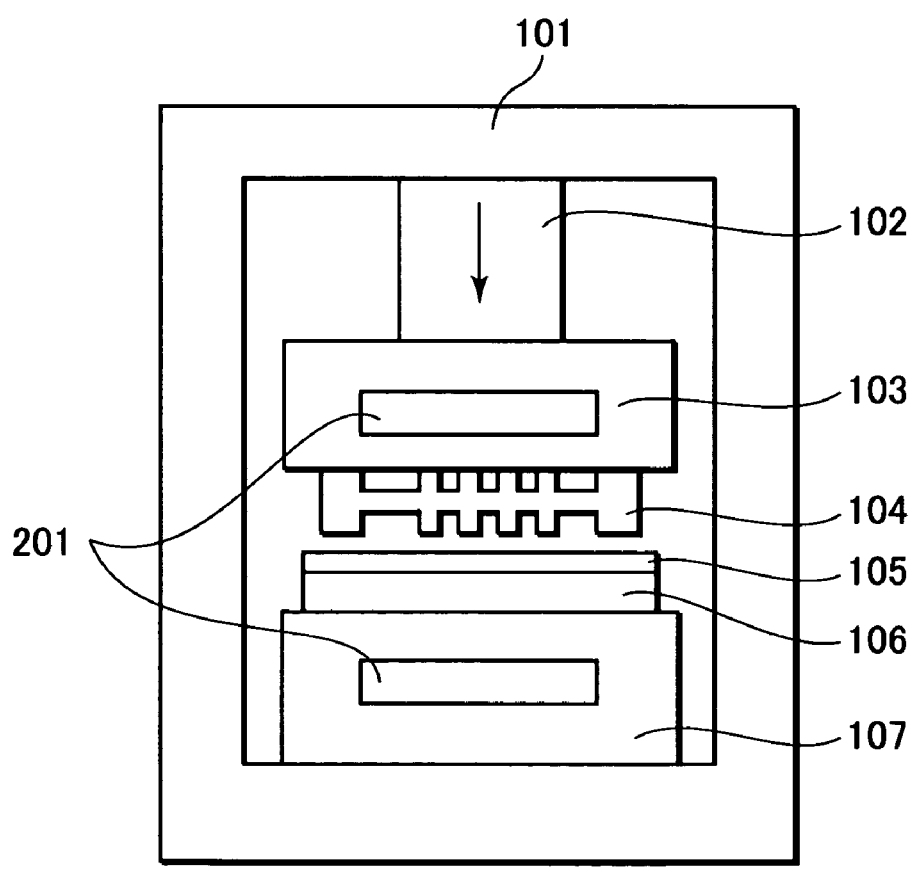
FIG. 2 is a cross sectional view for explaining the structure of an apparatus according to a second embodiment of the present invention.

As shown in FIG. 2, the mold 104 is arranged opposed to the wafer 106 coated with the resin 105. The mold 104 is mounted on the mold pressing member 103, while the wafer 106 is mounted on the wafer pressing member 107. Both of the pressing members are connected to each other through the press mechanism 102 and the casing 101 that receives a reactive force from the press mechanism 102. Further, a heater 201 is inserted in both of the pressing members for the purpose of heating the mold 104 and the resin 105. In operation, after the mold 104 and the wafer 106 are heated to a glass transition point of the resin 105, the press mechanism 102 applies pressure between the mold and the wafer to transfer the surface features of the mold 104 into the resin 105.

The mold 104 is, for example, manufactured as follows: A symmetrical front-back pattern is formed on both polished sides of Si wafer by photolithography or X-ray lithography using two masks that are mirror images of each other. In such a mold 104, the backside of a recess is also a recess. Therefore, when the surface of the mold 104 is pressed in the molding process, the recesses on the backside serve as the hollow portions in the paths of transmission of molding force, so that the transmission of the molding force to the recesses on the surface of the mold 104 can be reduced, thereby transferring the features on the mold 104 into the resin 105 with a high degree of precision. This also prevents a waste of molding force.

The method of making the mold 104 is not limited to the above-mentioned method. The symmetrical front/back pattern may also be formed using any other micro-fabrication technique, such as FIB (Focused Ion Beam) lithography or EB (Electron Beam) lithography. Like in the first embodiment, micro-machined areas on the backside may be restrictively selected. Further, the processed depth on the backside can be appropriately changed. For example, if the resin 105 is highly shapeable, the pattern on the backside may be made shallower.

In the embodiment, the mold 104 itself has portions for preventing in part the transmission of molding force. Since this structure is not affected by mounting errors, it is suitable for nano-patterning processes, especially for high-precision nano-fabrication processes. Further, since there is no difference in thermal expansion coefficient to cause misalignment, it is particularly suitable for nano-fabrication processes involving temperature changes, as well as the above-mentioned processes. Furthermore, since the features to be molded can be changed only by changing the mold 104, it is also suitable for large-item, small-scale production.

Third Embodiment

The third embodiment of the present invention will now be described with reference to FIG. 3.

Figure 3:
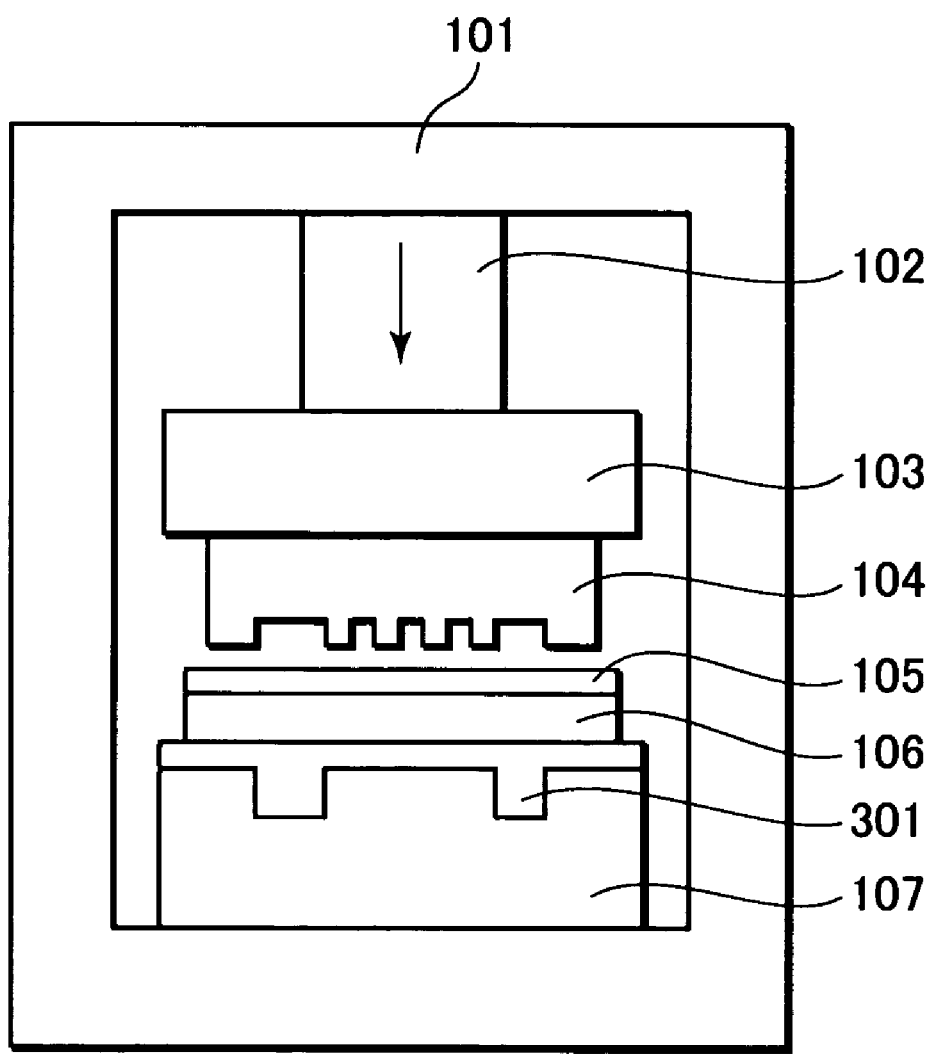
FIG. 3 is a cross sectional view for explaining the structure of an apparatus according to a third embodiment of the present invention.
Figure 4:
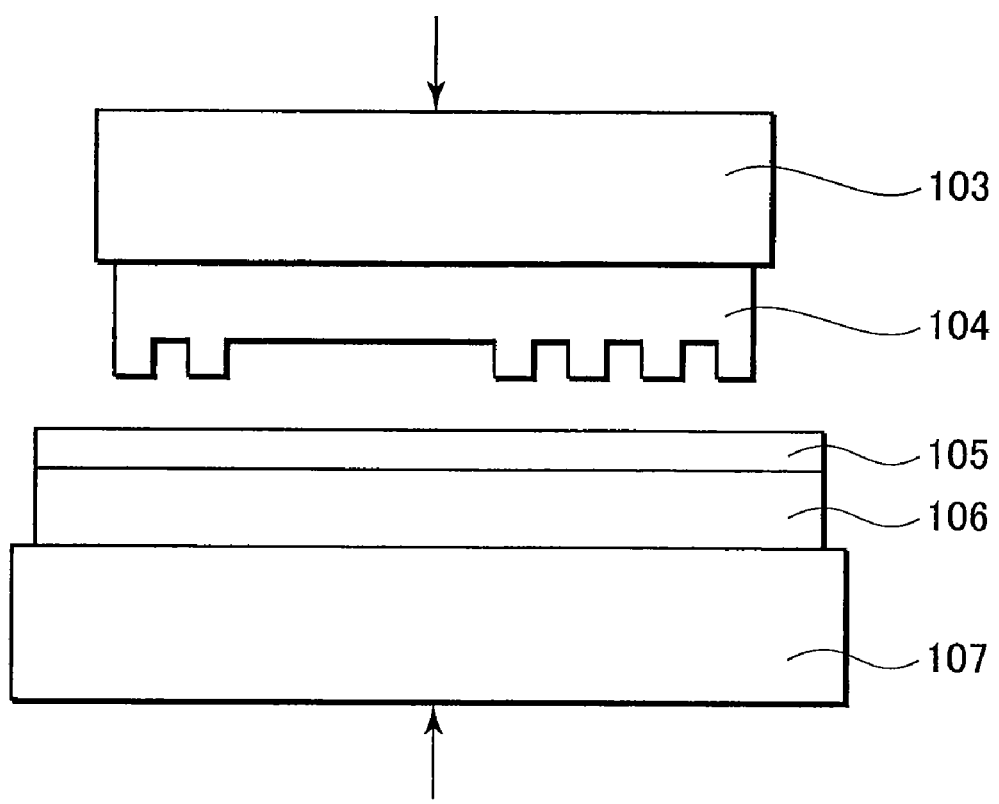
FIG. 4 is a cross sectional view for explaining the problem of the prior art technology.
Figure 5:
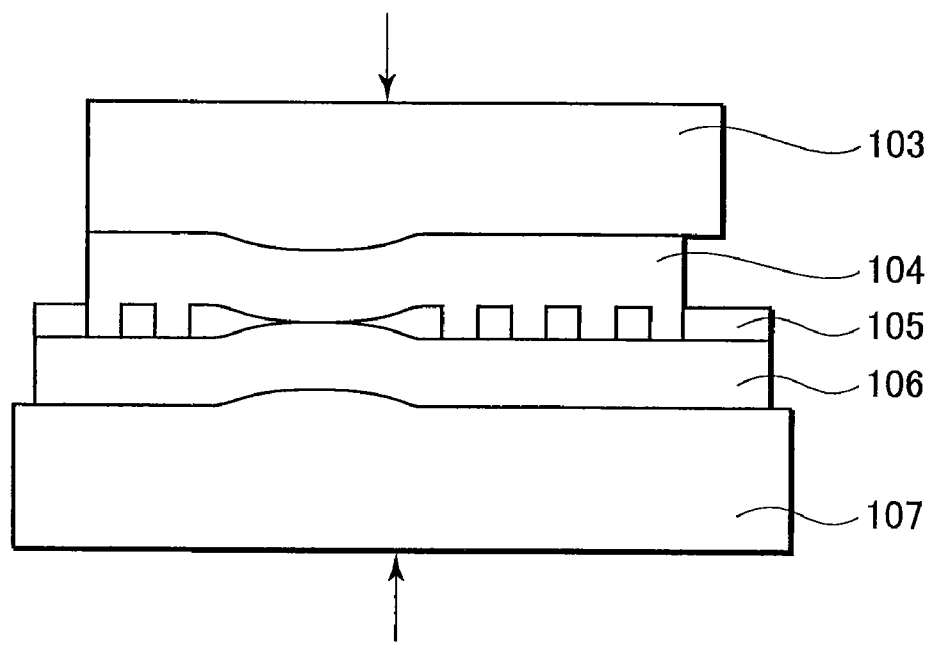
FIG. 5 is a cross sectional view for explaining the problem of the prior art technology.
Figure 6:
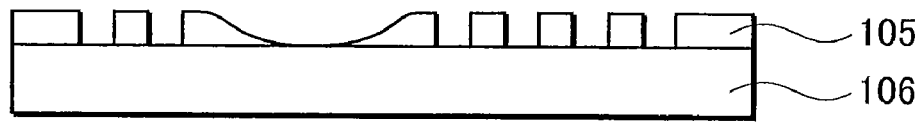
FIG. 6 is a cross sectional view for explaining the problem of the prior art technology.

As shown in FIG. 3, the mold 104 is arranged opposed to the wafer 106 coated with the resin 105. The mold 104 is mounted on the mold pressing member 103, while the wafer 106 is mounted on the wafer pressing member 107 through rubber 301. Both of the pressing members are connected to each other through the press mechanism 102 and the casing 101 that receives a reactive force from the press mechanism 102. The press mechanism 102 applies pressure between the mold 104 and the wafer 106 to transfer the surface features of the mold 104 into the resin 105.

Grooves of 100 μm deep are formed by precision cutting on the surface of the wafer pressing member 107 that faces the wafer 106. Each of the grooves is positioned directly below each recess of the mold 104. The pattern of the grooves may be the same as the pattern on the surface of the mold 104, but for the same reason as in the first embodiment, the grooves to be formed are restricted to only the areas corresponding to the recesses whose width-to-depth ratio exceeds 20:1 in their narrowest position on the mold 104. The surface on which the grooves have been formed is then coated with liquid rubber and cured. The thickness of the rubber 301 in the non-groove area is 100 μm.

When the wafer pressing member 107 as structured above is used to perform press molding, since the rubber in the grooves has low compressibility, it reduces the transmission of the molding force to the recesses of the mold 104, thereby enabling the transfer of the features on the mold 104 into the resin 105 with a high degree of precision.

Although in the embodiment the grooves are formed in the wafer pressing member 107 with the rubber 301 arranged thereon, they may be formed in the mold pressing member 103 as in the first embodiment, or in both members in the same manner. Further, if the rubber 301 is placed between the mold 104 in the second embodiment and the mold pressing member 103, the same effects can be obtained. In the embodiment, the rubber 301 is made by curing liquid rubber, but a slice of rubber may be mounted instead.

Any other material with low Young's modulus, such as various kinds of polymers or soft metal like indium, is selectable as appropriate instead of the rubber 301.

In the embodiment, the rubber 301 can distribute the molding force on the non-groove area evenly. Therefore, in addition to the applications shown in the first and second embodiments, it is suitable for a case where the shape precision of the components, such as the mold pressing member 103, the mold 104, the wafer 106, and the wafer pressing member 107, is inadequate due to limitations of fabrication technology and economics, or the precision of the apparatus is so inadequate that the mold 104 and the wafer 106 cannot be pressed while maintaining adequate horizontal alignment between them.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-044727 filed Feb. 20, 2004, which is hereby incorporated by reference herein.

What is claimed is:

1. A molding apparatus for patterning a workpiece, comprising:
   a mold having a pattern to be transferred to the workpiece, with the pattern including recesses;
   a first support member for supporting the mold;
   a second support member, arranged opposite to said first support member, for supporting the workpiece;
   a pressing mechanism to bring said first and second support members close to each other and press the mold and the workpiece together so as to transfer, to the workpiece, the pattern on said mold; and
   a recessed portion provided on a region of the first support member, said region in contact with a first surface of said mold, wherein
   said first surface of said mold is flat, and
   the recessed portion corresponds to recesses in the pattern of a second surface of said mold.

2. A molding apparatus according to claim 1, wherein said recessed portion contains a material with a Young's modulus lower than that of a material surrounding said recessed portion.

3. A molding apparatus according to claim 1, wherein the recessed portion is provided corresponding to wide recesses among said recesses in the pattern of said second surface of said mold.

* * * * *